(12) United States Patent  (10) Patent No.: US 8,754,685 B1
Nummer et al.  (45) Date of Patent: Jun. 17, 2014

(54) DELAY LOCKED LOOP

(71) Applicant: Taiwan Semiconductor Manufacturing Company, Ltd., Hsinchu (TW)

(72) Inventors: Muhammad Nummer, Nepean (CA); Dirk Pfaff, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/687,423

(22) Filed: Nov. 28, 2012

(51) Int. Cl.
*H03L 7/06* (2006.01)

(52) U.S. Cl.
USPC .......................................... 327/158; 327/149

(58) Field of Classification Search
None
See application file for complete search history.

(56) References Cited

U.S. PATENT DOCUMENTS

| | | | |
|---|---|---|---|
| 8,502,581 B1* | 8/2013 | Opris | 327/159 |
| 2011/0156766 A1* | 6/2011 | Ahn et al. | 327/142 |
| 2011/0156779 A1* | 6/2011 | Kim | 327/158 |

* cited by examiner

*Primary Examiner* — Cassandra Cox
(74) *Attorney, Agent, or Firm* — Lowe Hauptman & Ham, LLP

(57) ABSTRACT

A circuit includes a delay line and a delay locked loop. The circuit is configured to receive a delay parameter and a clock signal. The delay locked loop is configured to generate a pair of control codes based on a frequency of the clock signal and a frequency of an oscillator of the delay locked loop. The delay locked loop is configured to determine a difference between the frequency of the clock signal and the frequency of the oscillator based on a phase of an output of the oscillator and a phase of the clock signal after the output of the oscillator and the clock signal are aligned. The delay line is configured to receive an input signal and generate an output signal delayed from the input signal by a time delay that corresponds to a delay line control code calculated from the pair of control codes and the delay parameter.

19 Claims, 4 Drawing Sheets

DELAY LOCKED LOOP

FIELD

The present disclosure is related to a delay locked loop.

BACKGROUND

DDR stands for double data rate. Physical DDR interfaces (PHYs) require accurate timing when various signals, such as clock, command, address, and data signals are each launched. Incoming signals are also delayed to be captured. In some existing approaches, delay lines are used to delay such signals, but need to be compensated against manufacturing process, supply voltage, and temperature (PVT) variations.

In high speed operations of the DDR PHYs, such as operations in the range of Giga-bits per second, delay locked loops are used to calibrate the delay lines. Different ways of calibration are used. For example, calibration is performed once when the circuit is initialized or is performed continuously during operations of the circuits when the signals drift during circuit operations. Further, when semiconductor chips that have DDR interfaces and related circuits manufactured on a printed circuit board, board artifacts, such as trace length mismatches, need to be compensated.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
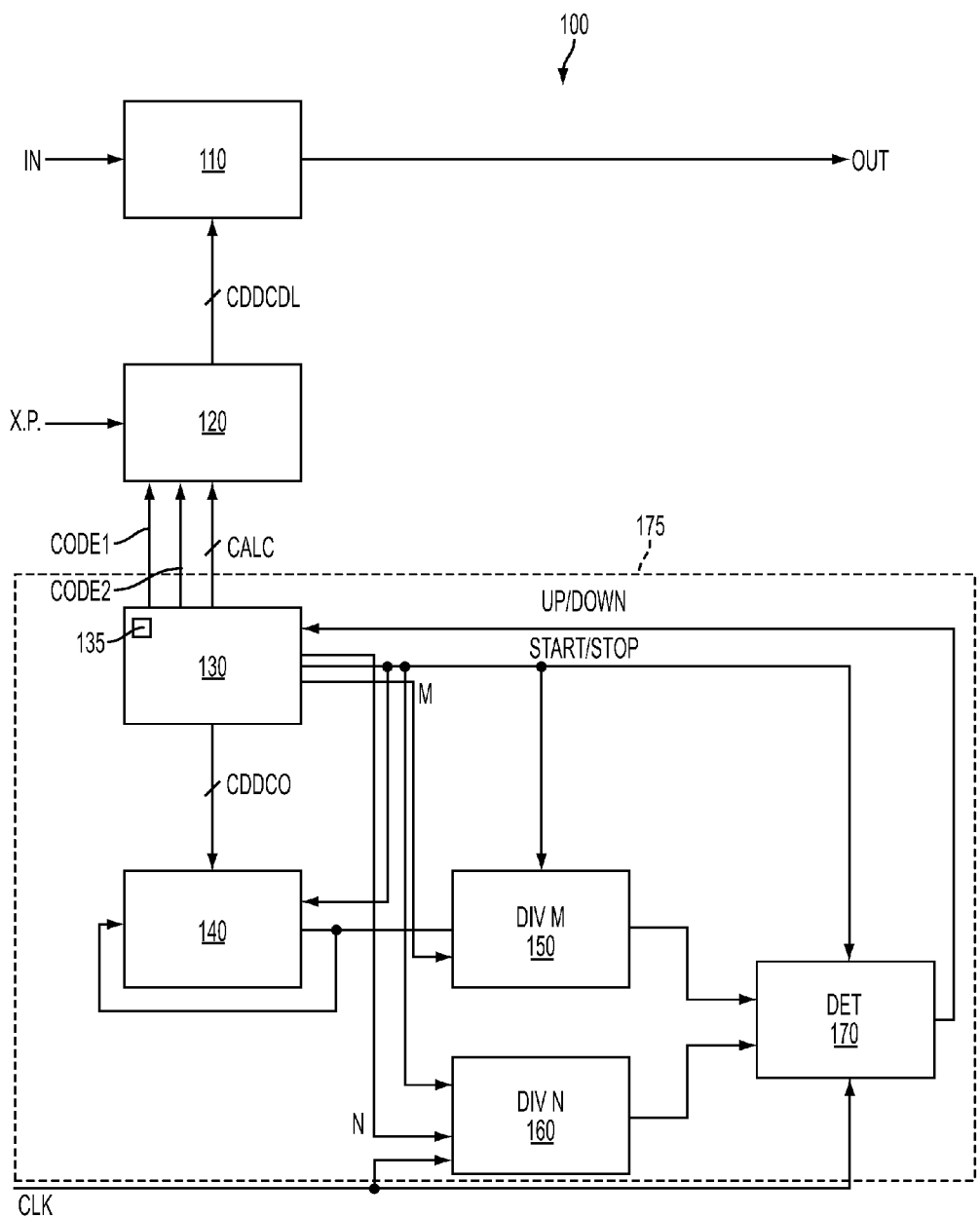
FIG. 1 is a diagram of a delay locked loop circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A digitally controlled oscillator (DCO) and a phase alignment mechanism are used in a delay locked loop (DLL). A first control code is interpolated or extrapolated from two other control codes. The first control code is then used to program a time delay of a digitally controlled delay line (DCDL). Compared with other approaches, a lock time of the DLL is sped up. Further, circuits in various embodiments of the present disclosure consume low power, occupy a small die area, and are compatible with deep-submicron complementary metal-oxide semiconductor (CMOS) technologies such as the 40, 28, or 20 nm semiconductor technology nodes.

Exemplary Circuit

FIG. 1 is a diagram of a circuit 100, in accordance with some embodiments. Circuit 100 is called a delay locked loop (DLL) circuit because circuit 100 includes a DLL 175. Circuit elements of circuit 100 are described with reference to FIG. 1. A method of operating circuit 100 is explained with reference to FIG. 4.

Circuit 100 receives an input signal IN, delay setting parameters X and P, and a clock signal CLK. Clock signal CLK has a constant frequency and a time period, which, for illustration, are called FCLK and TCLK, respectively. In some embodiments, based on a digital control code CDDCDL provided by an arithmetic unit (AU) 120, a digitally controlled delay line (DCDL) 110 generates an output signal OUT that is delayed by a time delay TDLY (not labeled) from input signal IN. In some embodiments, time delay TDLY depends on manufacturing process, supply voltage, and temperature. Effectively, circuit 100 is able to generate various time delays TDLY based on a range of control code CDDCDL, regardless of manufacturing process, supply voltage, and temperature.

In some embodiments, control code CDDCDL is generated based on delay setting parameters X and P and two control codes CODE1 and CODE2, which are obtained based on frequency FCLK. Mathematically expressed, frequency FLCK and time period TCLK of clock signal CLK are related by the equation FCLK=1/TCLK. As a result, in addition to depending on delay setting parameters X and P, time delay TDLY also depends on and is a function of time period TCLK. For example, in some embodiments, time delay TDLY equals period TCLK times a coefficient. As a result, depending on a value of the coefficient, time delay TDLY is equal to period TCLK, time delay TDLY is a multiple of period TCLK, time delay TDLY is a fraction of period TCLK, etc. Various embodiments of the disclosure are not limited to a particular relationship between time delay TDLY and time period TCLK.

In some embodiments, time delay TDLY is a linear function of control code CDDCDL (i.e., the value of the code CDDCDL). A relationship between time delay TDLY and control code CDDCDL is explained with reference to FIG. 2. In some embodiments, time delay TDLY is dependent on a manufacturing process, supply voltage, and temperature (PVT).

A delay locked loop (DLL) 175 includes a finite state machine (FSM) 130, a digitally controlled oscillator (DCO) 140, a frequency divider by M 150, labeled as DIV M 150, a frequency divider by N 160, labeled as DIV N 160, and a detector 170, labeled as DET 170. For illustration, a frequency of DCO 140 is called FDCO (not labeled). When DLL 175 is locked, frequency FCLK of clock signal CLK and frequency FDCO of DCO 140 are related based on a value of a division integer M and a division integer N as explained below. In some embodiments, frequency FLCK equals frequency FDCO times a coefficient. As a result, depending on a value of the coefficient, frequency FCLK is equal to frequency FDCO, frequency FCLK is a multiple of frequency FDCO, frequency FCLK is a fraction of frequency FDCO, etc. Other relationships of frequency FCLK and frequency FDCO when DLL 175 is locked are within the scope of various embodiments. For illustration, frequency FDCODIVM of the output signal of the frequency divider 150 is frequency FDCO divided by integer M and frequency FCLKDIVN of the output signal of the frequency divider 160 is frequency FCLK divided by integer N.

Finite state machine (FSM) 130 generates a signal CALC for AU 120 to calculate control code CDDCDL based on control codes CODE1 and CODE2. For example, in some embodiments, when DLL 175 is locked, control code CDDCDL is ready to be calculated based on control codes CODE1 and CODE2. As a result, FSM 130 generates signal CALC for AU 120 to perform the calculation. A mathematical equation to calculate control code CDDCDL is explained below.

In some embodiments, a value of control code CDDCO is loaded to DCO 140. In response DCO 140 oscillates at a frequency corresponding to the value of control code CDDCO loaded to DCO 140. When a value of control code CDDCO is to be adjusted, FSM 130 provides the adjusted value of control code CDDCO based on signals UP and DOWN generated by DET 170. For example, when FSM 130 receives signal UP, FSM 130 increases a value of control code CDDCO. In contrast, when FSM 130 receives signal DOWN, FSM 130 decreases a value of control code CDDCO. When FSM 130 does not receive signal UP or signal DOWN, and a time-out circuit 135 of the FSM 130 indicates a time out, frequency FDCODIVM and frequency FCLKDIVN are equal or are at least substantially close to one another. In such a condition, FSM 130 considers frequency FCLKDIVN and frequency FDCODIVM to be equal.

FSM 130 also generates a signal START and a signal STOP to control DCO 140, frequency divider DIV M 150, frequency divider DIV N 160, and DET 170. For example, FSM 130 generates signal STOP to reset DCO 140, frequency divider DIV M 150, frequency divider DIV N 160, and DET 170. In some embodiments, after generating signal STOP, FSM 130 generates signal START to activate frequency divider DIV M 150, frequency divider DIV N 160, and DET 170. Further, soon after signal START is generated, frequency divider DIV M 150 and frequency divider DIV N 160 generate corresponding signal DCODIVM (not labeled) and signal CLKDIVN (not labeled) in which a rising edge of signal DCODIVM is aligned with a rising edge of signal CLKDIVN. As a result, various embodiments of the disclosure are advantageous over other approaches as explained below.

FSM 130 also provides different values of integer N. For example, FSM 130 provides a first value of integer N, such as an integer N1, and a second value of integer N, such as an integer N2. Based on value N1 and value N2, FSM 130 provides corresponding codes CODE1 and CODE2. FSM 130 also provides a value of an integer M used by DIV M 150.

Digitally controlled oscillator (DCO) 140 is a replica of DCDL 110, except that an output of DCO 140 is coupled with an input of DCO 140. By a configuration of the input being coupled with the output, DCO 140 functions as a ring oscillator oscillating at a frequency, such as frequency FDCO. A value of control code CDDCO corresponds to a value of a time delay in DCO 140, which, in turn, corresponds to a value of frequency FDCO. For example, when a value of control code CDDCO is loaded to DCO 140, a time delay is used by DCO 140 for DCO 140 to oscillate at a corresponding frequency FDCO. As a result, a value of frequency FDCO changes in response to a change in a value of control code CDDCO. Because DCO is a replica of DCDL 110, a relationship between control code CDDCO and a time delay in DCO 140 is similar to a relationship between control CDDCDL and time delay TDLY of DCDL 110.

Detector (DET) 170 compares signal DCODIVM (not labeled) and signal CLKDIVN (not labeled). For example, in some embodiments, after signals DCODIVM and CLKDIVN are aligned, DET 170 determines a phase relationship between signal DCODIVM and signal CLKDIVN. In such a condition, DET 170 determines which edge of signal DCODIVM or of signal CLKDIVN is earlier or later than a corresponding edge of the other signal, for example. In some embodiments, an edge of signal DCODIVM is earlier than an edge of signal CLKDIVN when signal DCODIVM transitions before signal CLKDIVN does. In such a situation, when DET 170 recognizes that a transition of signal DCODIVM has occurred, DET 170 determines that signal DCODIVM is earlier than signal CLKDIVN. In contrast, when DET 170 recognizes that a transition of signal CLKDIVN has occurred, DET 170 determines that signal CLKDIVN is earlier than signal DCODIVM. In some other embodiments, DET 170 recognizes signal DCODIVM is earlier than signal CLKDIVN when frequency FDCODIVM is greater than frequency FCLKDIVN. Similarly, DET 170 recognizes signal DCODIVM is later than signal CLKDIVN when frequency FDCODIVM is smaller than frequency FCLKDIVN. DET 170 also provides the comparison result for FSM 130 to adjust a value of control code CDDCO to be loaded to DCO 140. When control code CDDCO is adjusted, frequency FDCO is adjusted. Consequently, frequency FDCODIVM is also adjusted. For example, DET 170 generates signals UP and DOWN based on a relationship between a phase difference or an edge delay of signal DCODIVM and signal CLKDIVN or a relationship between frequency FDCODIVM and frequency FCLKDIVN. For another example, if frequency FLCKDIVN is greater than frequency FDCODIVM, a delay in DCO 140 is large. DET 170 then provides signal DOWN to FSM 130 for FSM 130 to reduce the delay in DCO 140. As a result, the time period for a rising or falling edge of a signal passing through the DCO 140 is shorter (i.e., DCO 140 runs faster), and thus frequency FDCO increases. Because frequency FDCO increases, frequency FDCODIVM, which is frequency FDCO divided by integer M, also increases. If frequency FLCKDIVN is lower than frequency FDCODIVM, however, a delay in DCO 140 is small. DET 170 then provides a signal UP to FSM 130 for FSM 130 to increase the delay in DCO 140. As a result, the time period for a rising or falling edge of a signal passing through the DCO 140 is longer (i.e., DCO 140 runs slower), and thus frequency FDCO decreases. Because frequency FDCO decreases, frequency FDCODIVM also decreases. In some embodiments, control code CDDCO and frequency FDCO are adjusted until frequency FDCODIVM is equal to frequency FCLKDIVN. In some embodiments, values of control code CDDCO are adjusted in a binary search manner. Various embodiments of the present disclosure, however, are not limited to how values of control code CDDCO are adjusted.

When frequency FLCKDIVN is substantially close to frequency FDCODIVM, frequency FLCKDIVN and frequency FDCODIVM are considered equal. In some embodiments, accuracy of DET 170 determines whether frequency FCLKDIVN and frequency FDCODIVM are equal. In some embodiments, when frequency FCLKDIVN and frequency FDCODIVM are equal or substantially close, DET 170 generates neither signal UP nor signal DOWN. Further, when a predetermined time-out period, after the generation of signal START, expires, time-out circuit 135 in FSM 130 indicates a time-out condition. Explained in a different way, when time-out circuit 135 indicates a time-out condition, frequency FCLKDIVN and frequency FDCODIVM are substantially the same. At that time, $FDCO=(M/N)*FCLK$.

Frequency divider DIV M 150 divides frequency FDCO of DCO 140 by an integer M and provides a signal DCODIVM having a frequency FDCODIVM. Mathematically expressed: FDCODIVM=FDCO/M.

Frequency divider DIV N 160 divides frequency FCLK of clock signal CLK by an integer N and provides a signal CLKDIVN having a frequency FCLKDIVN. Mathematically expressed: FCLKDIVN=FLCK/N.

In some embodiments, given a value of integer M and a value of integer N, when DLL 175 is locked, frequency FDCO, frequency FLCK, integer M, and inter N are related by the equation:

$$FDCO=(M/N)*FCLK$$

In some embodiments, if N1 is a first integer used by frequency divider DIV N 160, when DLL 175 is locked, a first frequency FDCO1 of DCO 140 is related by frequency FCLK of clock signal CLK by the equation:

$$FDCO1=(M/N1)*FCLK$$

In some embodiments, frequency FDCO1 corresponds to control code CODE1.

Similarly, if N2 is a second integer used by frequency divider DIV N 160, when DLL 175 is locked, a second frequency FDCO2 of DCO 140 is related by frequency FCLK of clock signal CLK by the equation:

$$FDCO2=(M/N2)*FCLK$$

In some embodiments, frequency FDCO2 corresponds to control code CODE2.

In some embodiments, a value of each of control code CODE1 and control CODE2 is obtained in a separate lock of DLL 175. In some other embodiments, when DLL 175 is locked, both values of control code CODE1 and control code CODE2 are obtained.

Arithmetic unit (AU) 120, upon receiving a signal CALC from FSM 130, calculates control code CDDCDL based on control code CODE1, control code CODE2, and delay setting parameters X and P. In some embodiments, after DLL 175 is locked, two control codes CODE1 and CODE2 are ready to be used for such calculation of control code CDDCDL. Details of how codes CODE1 and CODE2 are generated are explained below with reference to FIG. 4. In some other embodiments, control code CODE1 is achieved based on a first lock of DLL 175 while control code CODE2 is achieved based on a second lock of DLL 175. Various embodiments of the present disclosure are not limited by how control codes CODE1 and CODE2 are generated.

In some embodiments, AU 120 calculates control code CDDCDL using linear interpolation/extrapolation based on one of the following equations $$CDDCDL=((CODE2-CODE1)*M*(X/P)-\\((N1*CODE2)+(N2*CODE1)))/(N2-N1) \quad (1)$$

or $$CDDCDL=((CODE2-CODE1)*M*(X/P))/(N2-N1) \quad (2)$$

wherein M is an integer used by frequency divider DIV M 150 to generate frequency FDCODIVM. Control code CODE1 corresponds to a first integer N1 and control code CODE2 corresponds to a second integer N2 used by frequency divider DIV N 160 to generate corresponding frequency FCLKDIV1 (not labeled) and FCLKDIV2 (not labeled), for example. Further, for illustration, when DLL 175 is locked, a first frequency FDCO1 of DCO 140 corresponds to integer N1, and a second frequency FDCO2 of DCO 140 corresponds to integer N2. Frequency FCLK, integer M, frequency FDCO1, frequency FDCO2, integer N1, and integer N2 satisfy the following equations $$FDCO1=(M/N1)*FCLK$$

$$FDCO2=(M/N2)*FCLK$$

In some embodiments, each control code CDDCDL corresponds to a time delay TDLY of DCDL 110. When DCDL 110 receives control code CDDCDL, DCDL 110 programs itself with the corresponding time delay TDLY. In response to a transition of input signal IN, DCDL 100 generates output signal OUT that is signal IN delayed by time delay TDLY.

In some embodiments, if control code CDDCDL is calculated based on equation (1) above, by operations of circuit 100, time delay TDLY satisfies the following equation:

$$TDLY=(X/P)*TCLK \quad (3)$$

wherein TLCK is a period of clock signal CLK.

If control code CDDCDL is calculated based on equation (2), however, by operations of circuit 100, time delay TDLY satisfies the following equation:

$$TDLY=DMIN+((X/P)*TCLK)) \quad (4)$$

wherein DMIN is a minimum delay that can be achieved from DCDL 110.

In FIG. 1, one DCDL 110 is shown for illustration. More than one DCDL 110 used in circuit 100 is within the scope of various embodiments. In some embodiments, when more than one DCDL 110 are used, each DCDL 110 has a separate input, a separate output, and a corresponding set of delay setting parameters X and P.

Time Delay TDLY and Control Code CDDCDL

Figure 2:
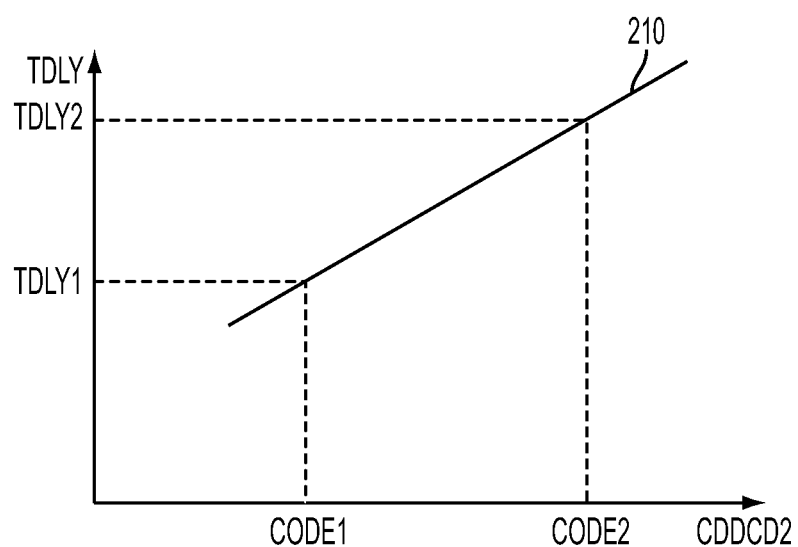
FIG. 2 is a graph of a relationship between the control code and time delay in FIG. 1, in accordance with some embodiments.

FIG. 2 is a graph of a relationship between control code CDDCDL and time delay TDLY of DCDL 110, in accordance with some embodiments. The X-axis represents values of control code CDDCDL while the Y-axis represents values of time delay TDLY.

A line 210 is a straight line indicating that a relationship between control code CDDCDL and time delay TDLY is linear. Further, a value of control code CDDCDL corresponds to a value of time delay TDLY, and vice versa. For example, through line 210, a control code CODE1 corresponds to a time delay TDLY1. Similarly, a control code CODE2 corresponds to a time delay TDLY2.

Illustrative Waveforms

Figure 3:
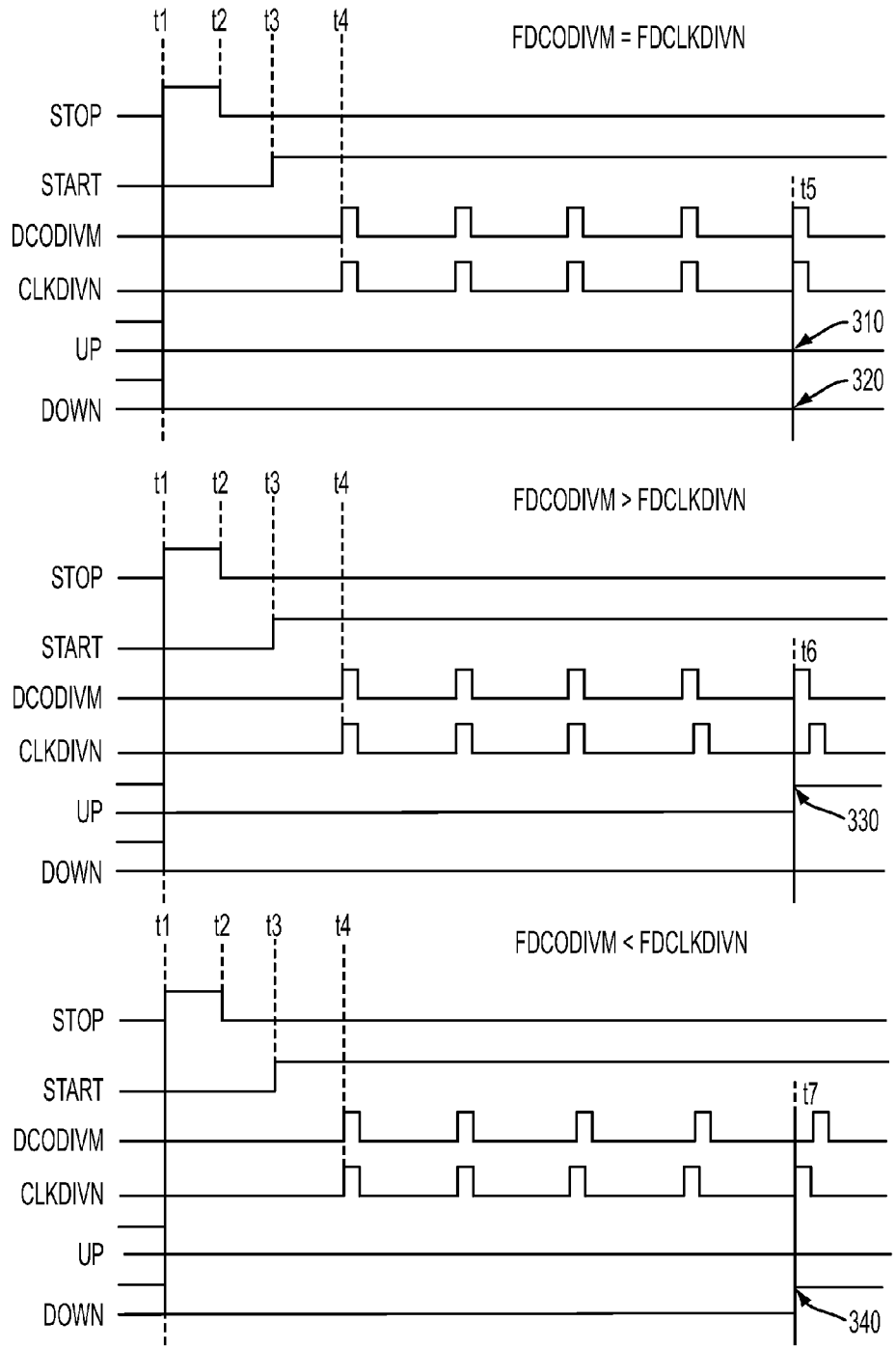
FIG. 3 is a graph of waveforms of various signals in the circuit of FIG. 1, in accordance with some embodiments.

FIG. 3 is a graph of three sets of waveforms, in accordance with some embodiments. The first set of waveforms illustrates frequency FDCODIVM is substantially close to frequency FCLKDIVN. Effectively, in some embodiments, frequency FDCODIVM is considered equal to frequency FCLKDIVN. The second set of waveforms illustrates frequency FDCODIVM is higher than frequency FCLKDIVN. The third set of waveforms illustrates frequency FDCODIVM is lower than frequency FCLKDIVN.

Between a time t1 and a time t2, FSM 130 generates signal STOP to DCO 140, frequency divider DIV M 150, frequency divider DIV N 160, and DET 170. In response, DCO 140, frequency divider DIV M 150, frequency divider DIV N 160, and DET 170 each stop their operations. In some embodiments, DCO 140, frequency divider DIV M 150, frequency divider DIV N 160, and DET 170 are each reset.

At time t1, DET 170 resets signals UP and DOWN to a low logical value.

At a time t3, FSM 130 generates signal START to activate DCO 140, frequency divider DIV M 150, frequency divider DIV N 160, and DET 170.

At a time t4, frequency divider DIV M 150 generates signal DCODIVM having frequency FDCODIVM. Similarly, frequency divider DIV N 160 generates signal CLKDIVN having frequency FCLKDIVN. In some embodiments, frequency divider DIV M 150 and frequency divider DIV N 160 start at about the same time based on a rising edge of signal START, which is called a phase alignment. Because frequency divider DIV M 150 and frequency divider DIV N 160 start at about the same time, a rising edge of signal DCODIVM and a rising edge of CLKDIVN are aligned with one another at time t4.

At times t5, t6, and t7, detector DET 170 is able to determine a time, a phase and/or a frequency relationship between signal DCODIVM and signal CLKDIVN. For example, at time t5, DET 170 detects that frequency FCLKDIVN is substantially close to frequency FDCODIVM. In response, in some embodiments, DET 170 does not generate signal UP nor signal DOWN. As a result, both signals UP and DOWN continue to have a low logical value as illustrated by arrows 310 and 320. Because both signals UP and DOWN each have a low logical value, time-out circuit 135 indicates a time-out condition after a predetermined time from time t3 when signal START is generated.

At time t6, however, DET 170 detects that frequency FDCODIVM is larger than frequency FCLKDIVN. Detector DET 170 then generates signal UP having a high logical value as illustrated by arrow 330. In such a condition, FSM 130 increases a value of control code CDDCO to increase a time delay in DCO 140. As a result, DCO 140 runs slower, and frequencies FDCO and FDCODIVM decrease.

In contrast, at time t7, DET 170 detects that frequency FCLKDIVN is larger than frequency FDCODIVM. DET 170 then generates signal DOWN having a high logical value as illustrated by arrow 340. In such a condition, FSM 130 decreases a value of control code CDDCO to decrease a time delay in DCO 140. As a result, DCO 140 runs faster, and frequencies FDCO and FDCODIVM increase.

At time t4 when rising edges of signals DCODIVM and CLKDIVN are aligned, a time from time t3 to time t5, t6, or t7 for DET 170 to recognize a relationship between frequency FCLKDIVN and frequency FDCODIVM is shorter than a corresponding time in other existing approaches. For example, in other existing approaches, when a detector starts detecting the relationship between signals DCODIVM and CLKDIVN, the rising edges of signals DCODIVM and CLKDIVN are not aligned. As a result, in the other existing approaches, recognizing the relationship between frequency FCLKDIVN and frequency FDCODIVM at time t5, t6, or t7 occurs after a long period of time when detection is triggered. For another example, in FIG. 3, after about four cycles from time t3 when signal START is activated, DET 170 is able to detect the relationship between frequency FCLKDIVN and frequency FDCODIVM. In contrast, in other exiting approaches, it takes up to a few hundred or thousand cycles from time t3 before the relationship between frequency FCLKDIVN and frequency FDCODIVM is detectable. Consequently, locking time of DLL 175 of the present disclosure is faster than locking time of a corresponding DLL in the other existing approaches.

In FIG. 3, recognizing a relationship between frequency FCLKDIVN and frequency FDCODIVM in about four cycles is for illustration. A number of cycles other than four is within the scope of various embodiments. In some embodiments, the number of cycles depends on a frequency difference between frequency FCLKDIVN and frequency DCODIVM. Further, when the frequency difference is larger, the number of cycles is smaller. In contrast, when the frequency difference is smaller, the number of cycles is larger. Explained in a different way, a response time to recognize the relationship between frequency FCLKDIVN and frequency FDCODIVM depends on the frequency difference. Additionally, a larger frequency difference results in a faster response time while a smaller frequency difference results in a slower response time and, a potential time-out.

Recognizing a relationship between frequency FCLKDIVN and frequency FDCODIVM as illustrated above with reference to FIG. 3 is based on a difference between the rising edges or phases of signals CLKDIVN and DOCDIVM, and is called a phase comparison versus a frequency comparison used by other existing approaches.

Exemplary Method

Figure 4:
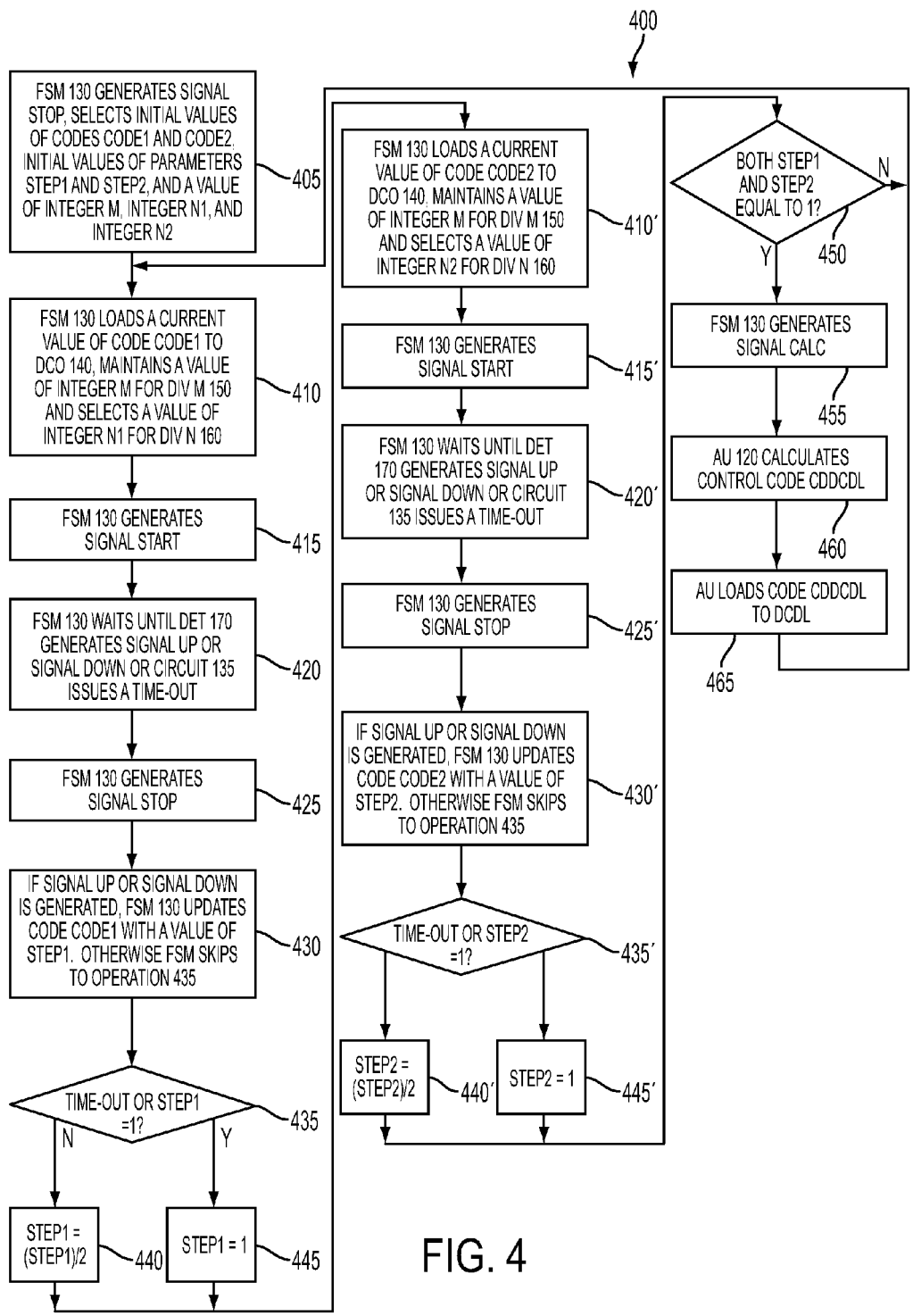
FIG. 4 is a flowchart of a method of operating the circuit in FIG. 1, in accordance with some embodiments.

FIG. 4 is a flowchart of a method 400 in accordance with some embodiments.

In this illustration, a value of control code CDDCO loaded to DCO 140 to change frequency FDCO and FDCODIVM is obtained by a binary search manner. For example, with reference to control code CODE1, a value of a parameter Step1 is used to adjust a value of control code CODE1. In some embodiments, the value of parameter Step1 is added when DET 170 generates signal UP. In contrast, the value of parameter Step1 is subtracted when DET 170 generates signal DOWN. Each time a value of control code CODE1 is adjusted, parameter Step1 is divided by 2. When parameter Step1 equals to 1, a binary search for the value of control code CODE1 is completed. In some embodiments, in operations regarding control code CODE1, a value of control code CODE1 fed to AU 120 is the same as a value of control code CDDCL loaded to DCO 140.

Similarly, with reference to control code CODE2, a value of a parameter Step2 is used to adjust a value of control code CODE2. Similar to code CODE1, in some embodiments, the value of parameter Step2 is added when DET 170 generates signal UP. In contrast, the value of parameter Step2 is subtracted when DET 170 generates signal DOWN. Each time a value of control code CODE2 is adjusted, parameter Step2 is divided by 2. When parameter Step2 equals to 1, a binary search for the value of control code CODE2 is completed. In some embodiments, in operations regarding control code CODE2, a value of control code CODE2 fed to AU 120 is the same as a value of control code CDDCL loaded to DCO 140.

In some embodiments, when both parameters Step1 and Step2 equal to 1, DLL 175 is locked. As a result, $$FDCO1 = (M/N1) * FCLK$$

$$FDCO2 = (M/N2) * FCLK$$

wherein FDCO1 is the frequency of DCO 140 that corresponds to integer N1 used by frequency divide DIV N 160, and FDCO2 is the frequency of DCO 140 that corresponds to integer N1 used by frequency divide DIV N 160.

In operation 405, FSM 130 generates signal STOP to reset DCO 140, frequency divider DIV M 150, frequency divider DIV N 160, and DET 170. FSM 130 also selects initial values of codes CODE1 and CODE2, initial values of parameters Step1 and Step2, and a value of integer M, integer N1, and integer N2.

In operation 410, FSM 130 loads a value of control code CDDCO to DCO 140. For illustration, in this instance, the value of control code CDDCO is a current value of control code CODE1. FSM 130 also maintains a value of integer M to frequency divider DIV M 150 to divide frequency FDCO. FSM 130 further selects a first value N1 for use by frequency divider DIV N 160 to divide frequency FCLK.

In operation 415, FSM 130 generates signal START to activate DCO 140, frequency divider DIV M 150, frequency divider DIV N 160, and DET 170. As a result, frequency divider DIV M 150 generates signal DCODIVM having frequency FDCODIVM. Similarly, frequency divider DIV N 160 generates signal CLKDIVN having frequency FCLKDIVN. DET 170 is therefore ready to compare frequency FDCODIVM and frequency FCLKDIVN.

In operation 420, FSM 130 waits until DET 170 generates signal UP or signal DOWN, or until circuit 135 issues a time-out.

In operation 425, FSM 130 generates signal STOP to reset DCO 140, frequency divider DIV M 150, frequency divider DIV N 160, and DET 170

In operation 430, FSM 130 determines whether frequency FDCODIVM and frequency FCLKDIVN are not equal. Effectively, FSM 130 determines whether DET 170 generates signal UP or signal DOWN because if signal UP or signal DOWN is generated, frequency FDCODIVM and FCLKDIVN are not equal. In such a condition, FSM 130 updates code CODE1 with a current value of parameter Step1. If neither signal UP nor DOWN is generated, frequency FDCODIVM and frequency FCLKDIVN are equal. FSM 130 skips operation 430 and proceeds to operation 435.

In operation 435, FSM 130 determines whether frequency FDCODIVM and FCLKDIVN are equal. Effectively, FSM 130 determines whether circuit 135 has issued a time-out in operation 420. If a time-out has not been issued in operation 420, FSM 130 divides a value of parameter Step1 by 2 in operation 440, for a binary search operation.

In operation 435, however, if a time-out has been issued in operation 420, FSM 130 recognizes that frequency FDCODIVM is equal to frequency FCLKDIVN. As a result, FSM 130 in operation 445 assigns a value 1 to parameter Step1 to force FSM 130 to abandon the binary search. Further, if frequency FDCODIVM is equal to frequency FCLKDIVN in a previous cycle, then parameter Step1 also equals to 1. FSM 130 in operation 445 assigns a value 1 to parameter Step1 to also indicate that FDCODIVM is equal to frequency FCLKDIVN.

In various embodiments, if only one parameter Step1 or Step2 has a value 1, FSM 130 continues to assign a value 1 to that parameter, and waits until the other parameter to have a value 1. When both parameters Step1 and Step2 have a value 1, FSM 130 considers DLL 175 has been locked and generate signal CALC for AU 120 to calculate control code CDDCDL, which starts in operation 450 below.

After either operation 440 or operation 445, a cycle related to CODE1 has completed. Operations 410' to 445' are related to a cycle of control code CODE2. For example, after either operations 440 or 445, method 400 continues to operations 410', 415', 420', 425', 430', 435', 440', and 445', which correspond to operations 410, 415, 420, 425, 430, 435, 440, and 445, except that in operations 410' to 445', the operations are related to control code CODE2 based on a value N2 of integer N used by frequency divider DIV N 160.

For example, in operation 410', FSM 130 loads another value of control code CDDCO to DCO 140, which is a current value of control code CODE2. FSM 130 maintains the same value for integer M for use by frequency divider DIV M 150 to divide frequency FDCO. FSM 130, however, selects a second value N2 for use by frequency divider DIV N 160 to divide frequency FCLK. Value N2 corresponds to code CODE2.

In operation 415', FSM 130 generates signal START to activate DCO 140, frequency divider DIV M 150, frequency divider DIV N 160, and DET 170.

In operation 420', FSM 130 waits until DET 170 generates signal UP or signal DOWN, or until circuit 135 issues a time-out.

In operation 425', FSM 130 generates signal STOP to reset DCO 140, frequency divider DIV M 150, frequency divider DIV N 160, and DET 170.

In operation 430', FSM 130 determines whether frequency FDCODIVM and FCLKDIVN are not equal. Effectively, FSM 130 determines whether DET 170 generates signal UP or signal DOWN. If either signal UP or signal DOWN is generated, FSM 130 updates control code CODE2 with a current value of parameter Step2. If neither signal UP nor DOWN is generated, frequency FDCODIVM and frequency FCLKDIVN are equal. In such a condition, FSM 130 skips operation 430' and proceeds to operation 435'.

In operation 435', FSM 130 determines whether frequency FDCODIVM and FCLKDIVN are equal. Effectively, FSM 130 determines whether circuit 135 has issued a time-out in operation 420'. If a time-out has been not been issued in operation 420', FSM 130 divides a value of parameter Step2 by 2 in operation 440' for a binary search operation for the value of control code CODE2. In operation 435', however, if a time-out has been issued in operation 420', FSM 130 recognizes that frequency FDCODIVM is equal to frequency FCLKDIVN. As a result, FSM 130 in operation 445' assigns a value 1 to parameter Step2. Further, if frequency FDCODIVM is equal to frequency FCLKDIVN in a previous cycle, then parameter Step2 also equals to 1. FSM 130 in operation 445' assigns a value 1 to parameter Step2 to also indicate that FDCODIVM is equal to frequency FCLKDIVN.

After either operation 440' or operation 445' is complete, method 400 proceeds to operation 450. In operation 450, FSM 130 determines whether both parameters Step1 and Step2 equal to 1. If both parameters Step1 and Step2 equal to 1 as indicated by "Y," frequency FDCODIVM is equal to frequency FCLKDIVN for both situations of integer N1 and integer N2 that correspond to control code CODE1 and control CODE2. As a result, in operation 455, FSM 130 generates signal CALC. In some embodiments, at that time, control CODE1 and control CODE2 have been fed to AU 120.

AU 120 in operation 460 calculates a value of control code CDDCDL using either equation (1) or equation (2).

In operation 465, AU 120 loads the value of control code CDDCDL calculated in operation 460 to DCDCDL 110. DCDL 110 in turn identifies a time delay TDLY that corresponds to the value of control code CDDCDL and programs itself with time delay TDLY. In some embodiments, when input IN transitions from a low to a high logical value or from a high to a low logical value, output OUT is generated from input IN delayed by time delay TDLY. Explained in a different way, DCDL 110 generates output OUT delayed by time delay TDLY from input IN.

In operation 450, however, if FSM 130 determines that either one or both of parameter Step1 and parameter Step2 are not equal to 1, method 400 flows to operation 410 and proceeds from there accordingly. For example, FSM 130 loads a current value of control code CODE1 and determines whether frequency FDCODIVM corresponding to code CODE1 is equal to FCLKDIVN corresponding to code CODE1, from operations 410 to 445. FSM 130 also loads another current value of another control code CODE2 and determines whether frequency FDCODIVM corresponding to code CODE2 is equal to FCLKDIVN corresponding to code CODE2, from operations 410' to 445'. During the operations, FSM 130 also divides the values of parameter Step1 and parameter Step2 by 2, if needed. When either parameter Step1 or Step2 is not equal to 1, method 400 loops back to operation 410 and proceeds through the operations until both parameters Step1 and Step2 are equal to 1. Method 400 then proceeds to operations 455, 460, 465, etc.

After operation 465, method 400 also returns to operation 410 and proceeds from there accordingly. Effectively, to keep executing method 400, various embodiments of the present disclosure continuously update control code CDCDL to DCDL 110.

In flowchart 400, a binary search of the value of control code CDDCO to determine whether frequency FDCODIVM being equal to frequency FCLKDIVN is used for illustration. Other ways to find the value of control code CDDCO are within the scope of various embodiments.

In some embodiments, a circuit comprises a delay line and a delay locked loop. The circuit is configured to receive a delay parameter and a clock signal. The delay locked loop is configured to generate a pair of control codes based on a frequency of the clock signal and a frequency of an oscillator of the delay locked loop. The delay locked loop is configured to determine a difference between the frequency of the clock signal and the frequency of the oscillator based on a phase of an output of the oscillator and a phase of the clock signal after the output of the oscillator and the clock signal are aligned. The delay line is configured to receive an input signal and generate an output signal delayed from the input signal by a time delay that corresponds to a delay line control code calculated from the pair of control codes and the delay parameter.

In some embodiments, a circuit comprises a delay line, an arithmetic unit, a state machine, an oscillator, a first frequency divider, a second frequency divider, and a detector circuit. The delay line is configured to receive an input signal and generate an output signal delayed from the input signal by a time delay that corresponds to a first control code. The arithmetic unit is configured to receive a delay parameter, a second control code, and a third control code, and to generate the first control code. The state machine is configured to receive detection information and to generate the second control code, the third control code, and a fourth control code. The oscillator is configured to receive the fourth control code and to generate an oscillator output signal. The first frequency divider is configured to divide a frequency of the oscillator output signal to generate a first frequency divider output signal. The second frequency divider is configured to divide a frequency of a clock signal received by the circuit, and to generate a second frequency divider output signal. The detector circuit is configured to receive the first frequency divider output signal and the second frequency divider output signal, and to generate the detection information based on a phase difference of the first frequency divider output signal and of the second frequency divider output signal.

In some embodiments, based on a first control code and a second control code, a third control code is generated. Based on the third control code, an output signal is generated and is delayed from an input signal by a time delay that corresponds to the third control code. The first control code is obtained based on first relationship $FDCO1=(M/N1)*FCLK$. $FDCO1$ is a first frequency of an oscillator. M is an integer used to divide the first frequency of the oscillator. FCLK is a frequency of a clock signal. N1 is a first integer used to divide the frequency of the clock signal. The second control code is obtained based on a second relationship $FDCO2=(M/N2)*FCLK$. $FDCO2$ is a second frequency of the oscillator. M is the integer used to divide the second frequency of the oscillator. N2 is a second integer used to divide the frequency of the clock signal.

A number of embodiments have been described. It will nevertheless be understood that various modifications may be made without departing from the spirit and scope of the disclosure. For example, a low or high logical value of various signals used in the above description is for illustration. Various embodiments of the present disclosure are not limited to a particular logical value when a signal is activated and/or deactivated. Selecting different logical values is within the scope of various embodiments.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
   a delay line; and
   a delay locked loop,
   wherein
   the circuit is configured to receive a delay parameter and a clock signal;
   the delay locked loop is configured to generate a pair of control codes based on a frequency of the clock signal and a frequency of an oscillator of the delay locked loop;
   the delay locked loop is configured to determine a difference in a phase of a divided signal of the clock signal and a phase of a divided output of the oscillator after the divided output of the oscillator and the divided clock signal are aligned;
   the delay line is configured to receive an input signal and generate an output signal delayed from the input signal by a time delay that corresponds to a delay line control code calculated from the pair of control codes and the delay parameter; and
   the delay locked loop is configured to change a frequency of the oscillator corresponding to a first control code of the pair of control codes and to change a frequency of the oscillator corresponding to a second control code of the pair of control codes.

2. The circuit of claim 1, wherein
the time delay is related by the clock signal based on one of the following equations $$TDLY=(X/P)*TCLK; \text{ or}$$

$$TDLY=DMIN+((X/P)*TCLK);$$

TDLY represents a value of the time delay;
X represents a value of a first delay parameter;
P represents a value of a second delay parameter;
TCLK represents a value of a time period of the clock signal; and
DMIN represents a minimum value of a delay time of the delay line.

3. The circuit of claim 1, further comprising an arithmetic unit configured to calculate the delay line control code based on either one of the following equations:

$$CDDCDL=((CODE2-CODE1)*M*(X/P)-((N1*CODE2)+(N2*CODE1)))/(N2-N1) \text{ or}$$

$$CDDCDL=((CODE2-CODE1)*M*(X/P))/(N2-N1);$$

CDDCDL represents a value of the delay line control code;
CODE1 represents a value of a first control code of the pair of control codes;
CODE2 represents a value of a second control code of the pair of control codes;
M represents a value of an integer used in dividing the frequency of the oscillator;
X represents a value of a first delay parameter;
P represents a value of a second delay parameter;
N1 represents a value of a first division integer used in dividing the frequency of the clock signal corresponding to the first control code; and
N2 represents a value of a second division integer used in dividing the frequency of the clock signal corresponding to the second control code.

4. The circuit of claim 1, wherein the delay locked loop is configured to generate a signal to control the divided output of the oscillator and the divided clock signal such that, based on the signal, the divided output of the oscillator and the divided clock signal are aligned.

5. The circuit of claim 1, wherein the time delay and a value represented by the delay line control code are linearly related.

6. A circuit comprising:
a delay line configured to receive an input signal and generate an output signal delayed from the input signal by a time delay that corresponds to a first control code;
an arithmetic unit configured to receive a delay parameter, a second control code, and a third control code, and to generate the first control code;
a state machine configured to receive detection information and generate the second control code, the third control code, and a fourth control code;
an oscillator configured to receive the fourth control code and to generate an oscillator output signal;
a first frequency divider configured to divide a frequency of the oscillator output signal to generate a first frequency divider output signal;
a second frequency divider configured to divide a frequency of a clock signal received by the circuit, and to generate a second frequency divider output signal; and
a detector circuit configured to receive the first frequency divider output signal and the second frequency divider output signal, and to generate the detection information based on a phase difference of the first frequency divider output signal and of the second frequency divider output signal after the first frequency divider output signal and the second frequency divider output signal are aligned.

7. The circuit of claim 6, wherein
the state machine is further configured to control the arithmetic unit for the arithmetic unit to generate the first control code.

8. The circuit of claim 6, wherein
the state machine is further configured to control the oscillator, the first frequency divider, the second frequency divider such that an edge of the first frequency divider output signal is aligned with an edge of the second divider output signal.

9. The circuit of claim 6, wherein
the state machine is configured to indicate a time-out condition when the detection information indicates that the first frequency divider output signal and the second frequency divider output signal transition from a first logical value to a second logical value at about a same time.

10. The circuit of claim 6, wherein
the detection information includes a signal if one of the first frequency divider output signal and the second frequency divider output signal transitions from a first logical value to second logical value.

11. The circuit of claim 6, wherein the arithmetic unit is configured to calculate the first control code based on either one of the following equations:

$$CDDCDL=((CODE2-CODE1)*M*(X/P)-((N1*CODE2)+(N2*CODE1)))/(N2-N1) \quad (1) \text{ or}$$

$$CDDCDL=((CODE2-CODE1)*M*(X/P))/(N2-N1);$$

CDDCDL represents a value of the first control code;
CODE1 represents a value of the second control code;
CODE2 represents a value of the third control code;
M represents a value of an integer used in dividing a frequency of the oscillator;
X represents a first value of the delay parameter;
P represents a second value of the delay parameter;
N1 represents a value of a first division integer used in dividing the frequency of the clock signal corresponding to the second control code; and
N2 represents a value of a second division integer used in dividing the frequency of the clock signal corresponding to the third control code.

12. The circuit of claim 6, wherein
the time delay is related by the clock signal based on one of the following equations $$TDLY=(X/P)*TCLK; \text{ or}$$

$$TDLY=DMIN+((X/P)*TCLK);$$

TDLY represents a value of the time delay;
X and P are each a value of the delay parameter;
TCLK represents a value of a time period of the clock signal; and
DMIN represents a minimum value of a delay time of the oscillator.

13. A method comprising:
based on a first control code and a second control code, generating a third control code; and
based on the third control code, generating an output signal delayed from an input signal by a time delay that corresponds to the third control code,
wherein
the first control code is obtained based on a first relationship FDCO1=(M/N1)*FCLK;
FDCO1 is a first frequency of an oscillator when a delay locked loop is locked, M is an integer used to divide a frequency of the oscillator corresponding to the first control code, FCLK is a frequency of a clock signal, N1 is a first integer used to divide the frequency of the clock signal;
the second control code is obtained based on a second relationship FDCO2=(M/N2)*FCLK;
FDCO2 is a second frequency of the oscillator when the delay locked loop is locked, M is the integer used to divide a frequency of the oscillator corresponding to the second control code, N2 is a second integer used to divide the frequency of the clock signal; and
determining a relationship between a divided signal of an output signal of the oscillator and a divided signal of the clock signal is based on a phase of the divided signal of the output signal of the oscillator and a phase of the divided signal of the clock signal after the divided signal of the output signal of the oscillator and the divided signal of the clock signal are aligned.

14. The method of claim 13, further comprising:
changing a control code to change at least one of the first frequency and the second frequency of the oscillator.

15. The method of claim 13, further comprising:
changing a control code to change at least one of the first frequency and the second frequency of the oscillator in a binary search manner.

16. The method of claim 13, wherein the first relationship and the second relationship are obtained based on at least one lock of the delay locked loop.

17. The method of claim 13, wherein the first relationship is obtained based on a first lock of the delay locked loop and the second relationship is obtained based on a second lock of the delay locked loop.

18. The method of claim 13, wherein
obtaining the first control code comprises:
dividing the frequency of the oscillator corresponding to the first code by the integer M to result in a first oscillator divided signal;
dividing the frequency of the clock signal by the integer N1 to result in a first clock divided signal; and
determining a relationship between the first oscillator divided signal and the first clock divided signal after the first oscillator divided signal and the first clock divided signal are aligned; and
obtaining the second control code comprises:
dividing the second frequency of the oscillator corresponding to the second code by the integer M to result in a second oscillator divided signal;
dividing the frequency of the clock signal by the integer N2 to result in a second clock divided signal;
determining a relationship between the second oscillator divided signal and the second clock divided signal after the second oscillator divided signal and the second clock divided signal are aligned.

19. The method of claim 18, further comprising
generating a time-out condition based on the relationship between the first oscillator divided signal and the first clock divided signal or based on the relationship between the second oscillator divided signal and the second clock divided signal.

\* \* \* \* \*